(12) United States Patent
Hsu

(10) Patent No.: US 6,486,010 B1
(45) Date of Patent: Nov. 26, 2002

(54) METHOD FOR MANUFACTURING THIN FILM TRANSISTOR PANEL

(75) Inventor: Po Wen Hsu, Tainan (TW)

(73) Assignee: Chi Mei Optoelectronics Corp. (TW)

( * ) Notice: Subject to any disclaimer, the term of this patent is extended or adjusted under 35 U.S.C. 154(b) by 0 days.

(21) Appl. No.: 10/096,855

(22) Filed: Mar. 14, 2002

(51) Int. Cl.⁷ ............................................. H01L 21/84
(52) U.S. Cl. ....................................... 438/158; 438/163
(58) Field of Search ................................ 438/149, 151, 438/158, 159, 163, 165, 482

(56) References Cited

U.S. PATENT DOCUMENTS

| | | | |
|---|---|---|---|
| 6,022,764 A | * | 2/2000 | Park et al. ............... 438/151 |
| 6,403,407 B1 | * | 6/2002 | Andry et al. ............. 438/158 |
| 6,406,969 B2 | * | 6/2002 | Kim et al. ............... 438/151 |
| 2002/0013021 A1 | * | 1/2002 | Jeong et al. ............. 438/151 |

* cited by examiner

Primary Examiner—Chandra Chaudhari

(57) ABSTRACT

A method for manufacturing a thin film transistor panel includes the steps of forming a first metal pattern on an insulating substrate; depositing an insulating layer and a semiconductor layer including an impurity-doped layer over the insulating substrate having the first metal pattern sequentially; forming a photoresist pattern on the semiconductor layer, wherein the photoresist pattern includes a first portion facing the channel region of TFTs, a second portion that is thicker than the first portion, and a third portion having no photoresist; etching the semiconductor layer with the photoresist pattern as an etch mask; reducing the thickness of the photoresist pattern layer till the first portion of the photoresist pattern is removed; removing the impurity-doped layer exposed at the channel region; and forming a second metal pattern on the patterned semiconductor layer and the gate insulating layer.

13 Claims, 7 Drawing Sheets

METHOD FOR MANUFACTURING THIN FILM TRANSISTOR PANEL

BACKGROUND OF THE INVENTION

1. Field of the Invention

The present invention relates to a method for manufacturing a thin film transistor (TFT) panel.

2. Description of the Related Art

In order to minimize the space required by display devices, researches have been undertaken into the development of various flat panel display devices such as LCD display devices, plasma display panels (PDP) and electroluminescence displays (EL). Particularly, in the case of LCD display devices, liquid crystal technology has been explored because the optical characteristics of liquid crystal material can be controlled in response to changes in electric fields applied thereto.

At present, the dominant methods for fabricating liquid crystal display devices (LCD) and panels are methods based on amorphous silicon (a-Si) thin film transistor (TFT) technologies. Using these technologies, high quality image displays of substantial size can be fabricated by using low temperature processes. As will be understood by those skilled in the art, conventional LCD devices typically include a TFT panel, a color filter panel and a liquid crystal layer interposed therebetween.

FIG. 1 is a flowchart illustrating the steps of a conventional method of forming a TFT panel, and FIGS. 2a–2e are sectional views illustrating a portion of a TFT panel manufactured by the conventional method of FIG. 1.

A conventional method for manufacturing a TFT panel will now be described with reference to FIGS. 1 and 2a–2c. First, a first metal layer is sputtered on a transparent glass substrate 200 to a predetermined thickness (step 101). In FIG. 2a, the first metal layer is etched by a first photolithography process to form a gate electrode 202 and a gate line (not shown) on the substrate 200 (step 102). Then, an insulating layer (e.g., SiN, layer) is deposited on the entire surface of the substrate having the gate electrode 202 and the gate line (not shown) thereon to form a gate insulating layer 204. An amorphous silicon layer 206 and an impurity-doped amorphous silicon layer 208 (e.g., n+ amorphous silicon layer), are then sequentially deposited on the gate insulating layer 204 to form an amorphous semiconductor layer 210 (step 103). Next, as shown in FIG. 2b, the amorphous semiconductor layer 210 is patterned by a second photolithography process with a photoresist pattern 211 with substantially uniform thickness, resulting in an amorphous semiconductor pattern 212 on the TFT portion of the substrate 200 (step 104).

Then, a second metal layer such as Cr is sputtered on the entire surface of the gate insulating layer 204 and on the amorphous semiconductor pattern 212 to a predetermined thickness (step 105). As shown in FIG. 2c, the second metal layer is then patterned by a third photolithography process using a photoresist pattern 220 to form a data line (not shown), a source electrode 216 and a drain electrode 214 on the TFT portion of the substrate, wherein the source electrode 216 and the drain electrode 214 are separated by a channel portion 218 (step 106).

In FIG. 2d, the impurity-doped amorphous silicon layer 208 at the channel region 218 is etched by using the source and drain electrodes 216 and 214 as an etch-protect mask (step 107). Then, as shown in FIG. 2e, the photoresist pattern 220 is removed.

A passivation layer (not shown, e.g., SiN$_x$ layer) is then formed on the entire surface of the above structure to a predetermined thickness (step 108). The passivation layer is then patterned to expose parts of the drain electrode 214 using a fourth photolithography process (step 109). After forming an indium-tin-oxide (ITO) layer as a transparent conductive layer on the entire surface of the structure having the passivation layer pattern thereon (step 110), the ITO layer is patterned by a fifth photolithography process (step 111).

The steps 104 and 107 described above can be conducted by an etching equipment of the same type, but the intervening steps 105 and 106 are conducted by equipments different from the etching equipment used in the steps 104 and 107. Therefore, the etched product of the step 104 must be transported out of the etching equipment to the processing equipments of the steps 105 and 106, and then the processed product of the step 106 is transported back to the etching equipment for performing the step 107. It is desirable to perform the steps 104 and 107 sequentially because of the cost and lengthy time required for the additional transportation described above. Furthermore, the etching process of the step 107 may cause corrosion of the second metal pattern.

The present invention therefore seeks to provide an improved method for manufacturing a TFT panel that overcomes, or at least reduces the above-mentioned problems of the prior art.

SUMMARY OF THE INVENTION

It is an object of the present invention to provide a method for manufacturing a TFT panel which allows the patterning processes of the semiconductor layer and the impurity-doped layer to be conducted sequentially thereby reducing the manufacturing cost and increasing the productivity.

It is another object of the present invention to provide a method for manufacturing a TFT panel which resolves the above-mentioned corrosion issue of the second metal pattern.

In the manufacturing method of a thin film transistor panel of the present invention, a first metal pattern including at least a gate line with a gate electrode is formed on an insulating substrate such as a transparent glass substrate. Next, a gate insulating layer is deposited over the gate line. A semiconductor layer which comprises an amorphous silicon layer and an impurity-doped layer, e.g., an n+ amorphous silicon layer, is formed on the gate insulating layer.

Thereafter, a photoresist pattern is formed on the semiconductor layer. The photoresist pattern includes a first portion facing a channel region, a second portion that is thicker than the first portion, and a third portion having no photoresist. The semiconductor layer is etched by using the photoresist pattern as an etch mask to expose the gate insulating layer under the third portion of the photoresist pattern. Then, the thickness of the photoresist pattern layer is reduced, for example, by O$_2$ ashing, until the first portion of the photoresist.pattern is removed so as to expose the impurity-doped layer at the channel region. Then, the impurity-doped layer exposed at the channel region is removed by etching. Finally, a conductive pattern layer with source and drain electrodes, i.e., the second metal pattern, is formed over the patterned semiconductor layer and the gate insulating layer, wherein the drain and source electrodes are separated by the channel region.

According to a preferred embodiment of the present invention, the photoresist pattern is provided by the following steps. First, a photoresist film is formed on the semiconductor layer. Next, a mask with a predetermined pattern having at least a slit is placed on top of the photoresist film and the photoresist film is exposed to a light. Finally, the exposed photoresist film is developed to obtain the photoresist pattern with the thinner first portion formed corresponding to the slit of the mask.

In the manufacturing method of a thin film transistor panel of the present invention, the patterning processes of the semiconductor layer and the impurity-doped layer are performed sequentially. Therefore, the patterning steps described above can be conducted by the same etching equipment so as to skip the additional transportation between different equipments thereby reducing the manufacturing cost and increasing the productivity.

Furthermore, the impurity-doped layer is patterned before forming the second metal pattern so as to prevent the second metal pattern from being corroded by the etchant used in the patterning process thereby resolving the corrosion issue described above.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 1:
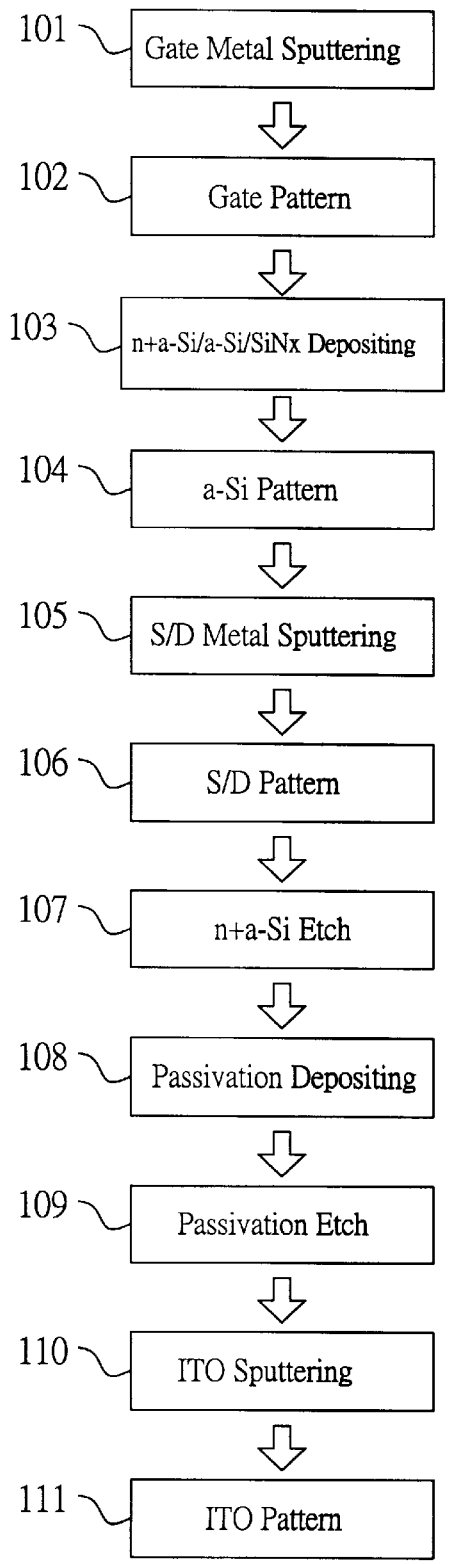
FIG. 1 is a flowchart illustrating a conventional method for manufacturing a thin-film transistor (TFT) panel.
Figure 2A:
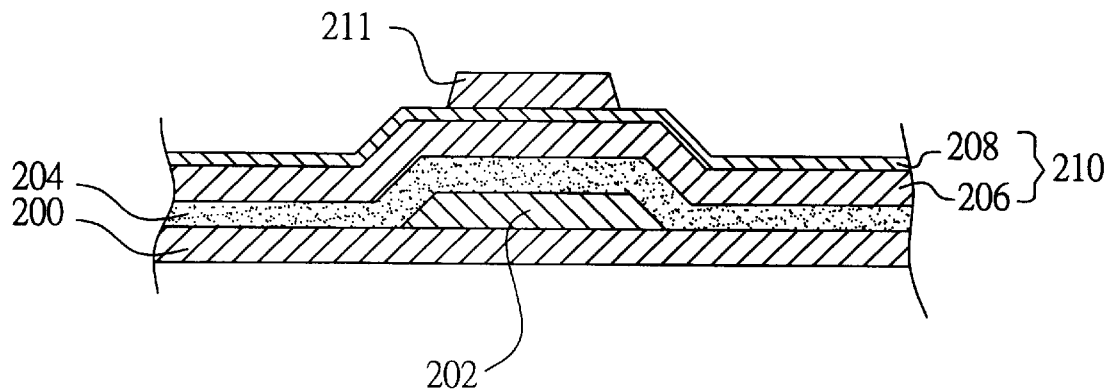
FIGS. 2a–2e illustrate, in cross-sectional view, the steps of fabrication of a TFT panel according to the method of FIG. 1.
Figure 2B:
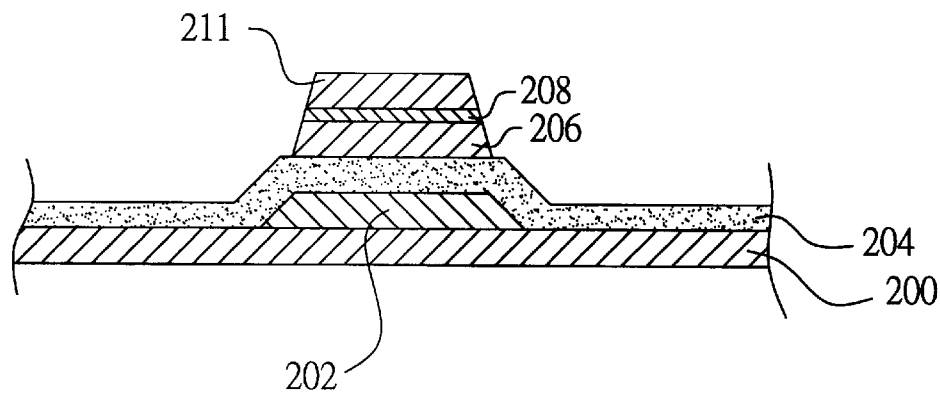
Figure 2C:
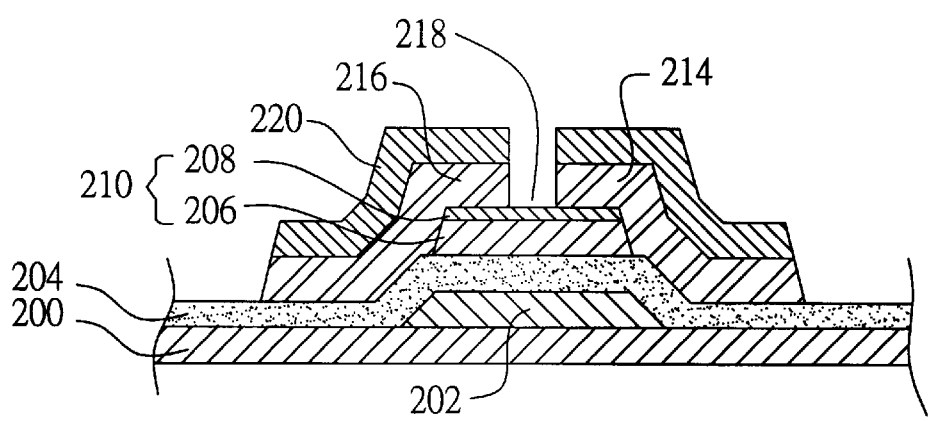
Figure 2D:
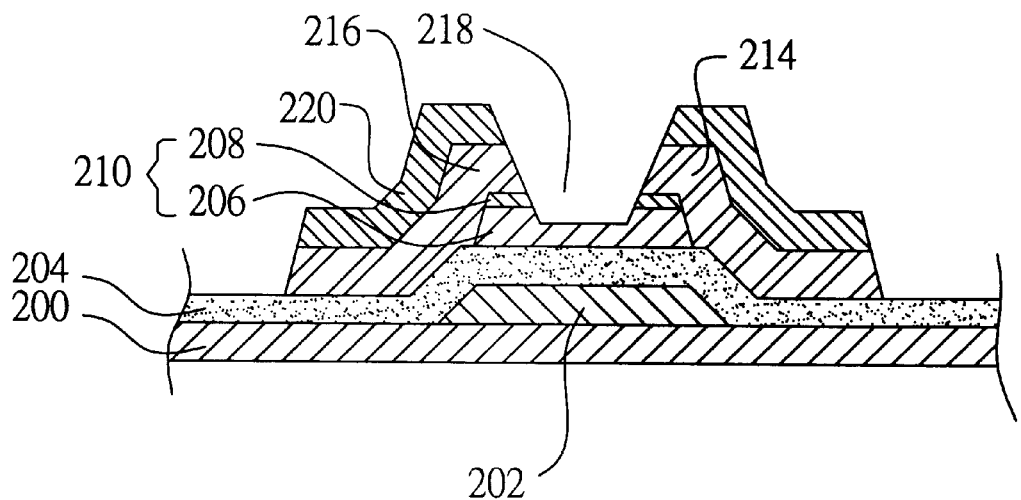
Figure 2E:
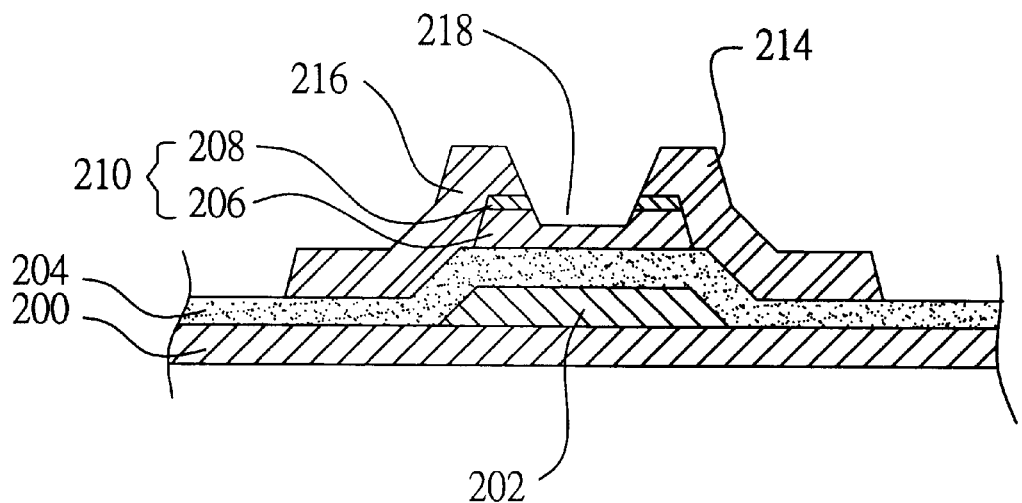

While the present invention is susceptible of embodiment in various forms, there is a presently preferred embodiment shown in the drawings and will hereinafter be described with the understanding that the present disclosure is to be considered as an exemplification of the invention and is not intended to limit the invention to the specific embodiment illustrated.

Figure 3:
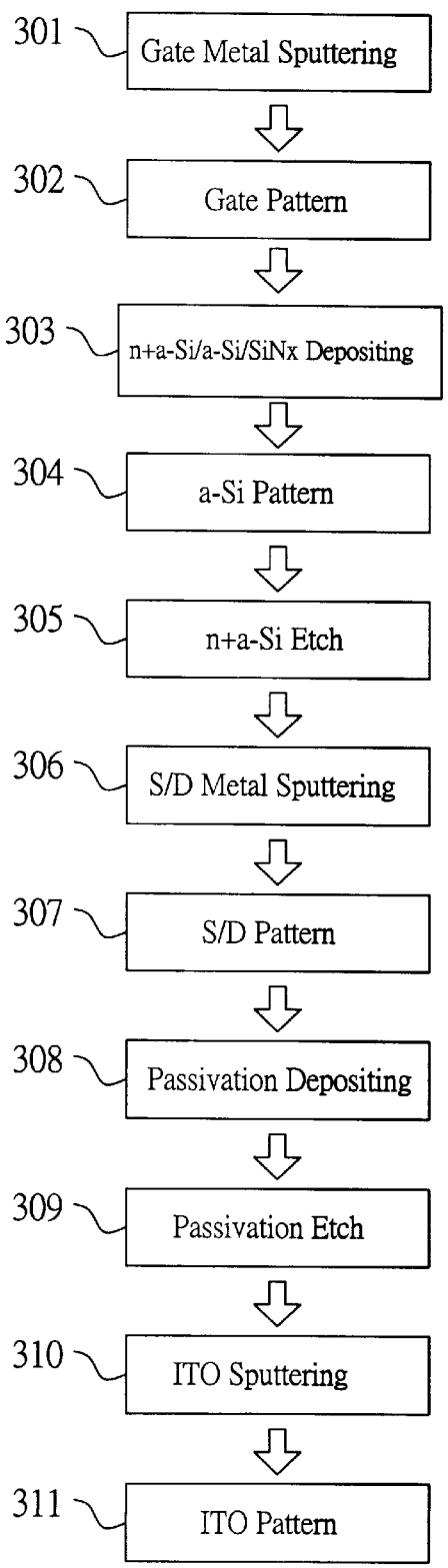
FIG. 3 is a flowchart illustrating a method for manufacturing a thin-film transistor (TFT) panel according to a preferred embodiment of the present invention.

FIG. 3 is a flowchart illustrating steps of a manufacturing method for forming a TFT panel according to a preferred embodiment of the present invention, and FIGS. 4a–4e are sectional views illustrating a portion of the TFT panel manufactured by the method of FIG. 3.

Figure 4A:
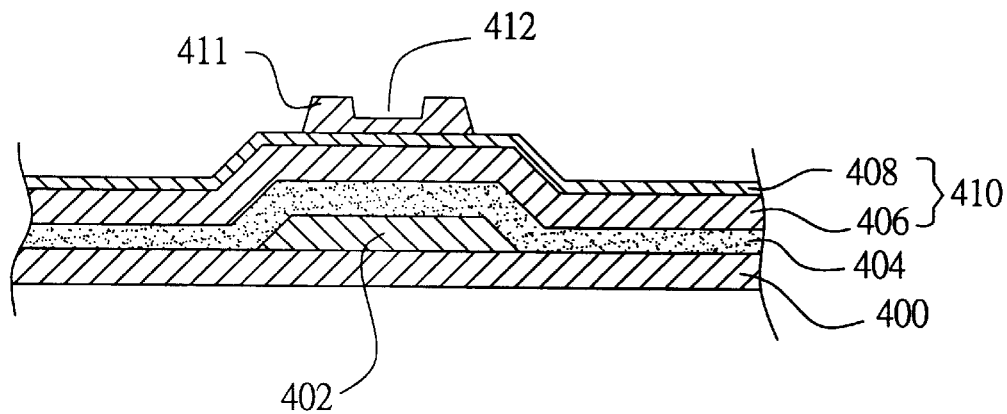
FIGS. 4a–4e illustrate, in cross-sectional view, the steps of fabrication of a TFT panel according to the method of FIG. 3.

The method for manufacturing a TFT panel according to the present invention will now be described with reference to FIGS. 3 and 4a–4e. First, a first metal layer is formed by sputtering on an insulating substrate 400 such as a transparent glass substrate to a predetermined thickness (step 301). In FIG. 4a, the first metal layer is patterned by a first photolithography process to form a first metal pattern including a gate, line with a gate electrode 402 on the substrate 400 (step 302). Then, an insulating layer (e.g., SiNx layer) is deposited over the entire surface of the substrate 400 having the gate line and the gate electrode 402 thereon to form a gate insulating layer 404. A semiconductor layer 410, which comprises an amorphous silicon layer 406 and an ohmic contact layer 408 such as impurity-doped layer (e.g., a n+ amorphous silicon layer), is formed on the gate insulating layer 404 (step 303).

Figure 4B:
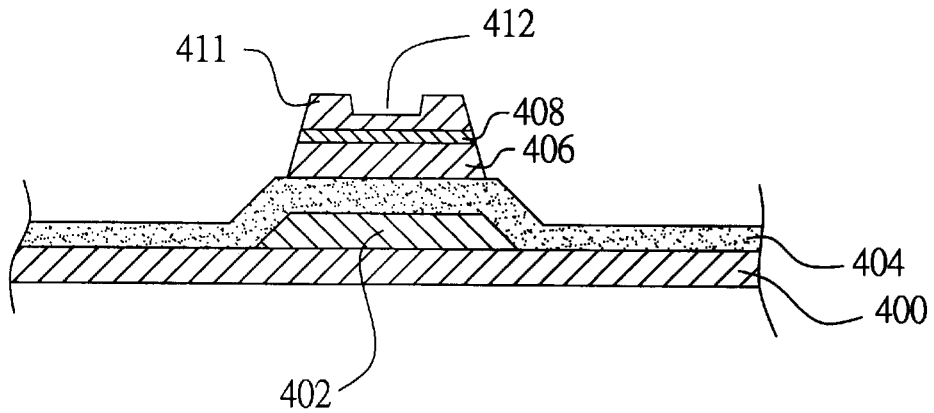

Next, as shown in FIG. 4b, the amorphous semiconductor layer 410 is patterned by a second photolithography process with a photoresist pattern 411 having concave portions 412 (step 304). The photoresist pattern 411 used herein includes a first portion (i.e., the concave portions mentioned above) facing the channel region of TFTs, a second portion that is thicker than the first portion, and a third portion has no photoresist layer. Specifically, in the step 304, the semiconductor layer is etched by using the photoresist pattern 411 as an etch mask to expose the gate insulating layer 404 under the third portion of the photoresist pattern 411.

Figure 4C:
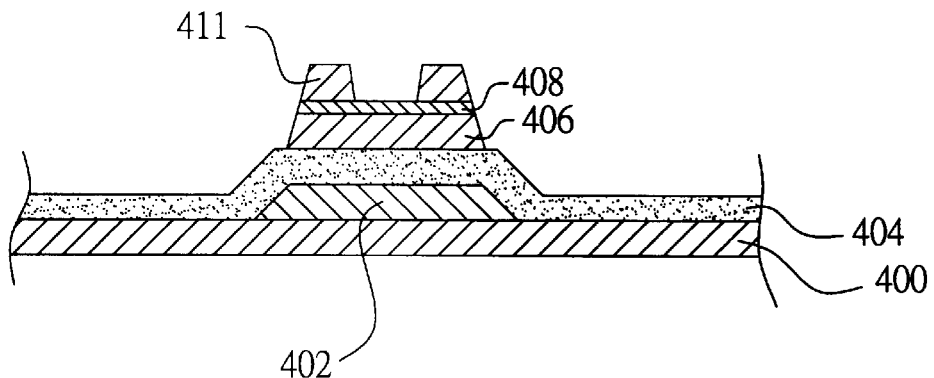
Figure 4D:
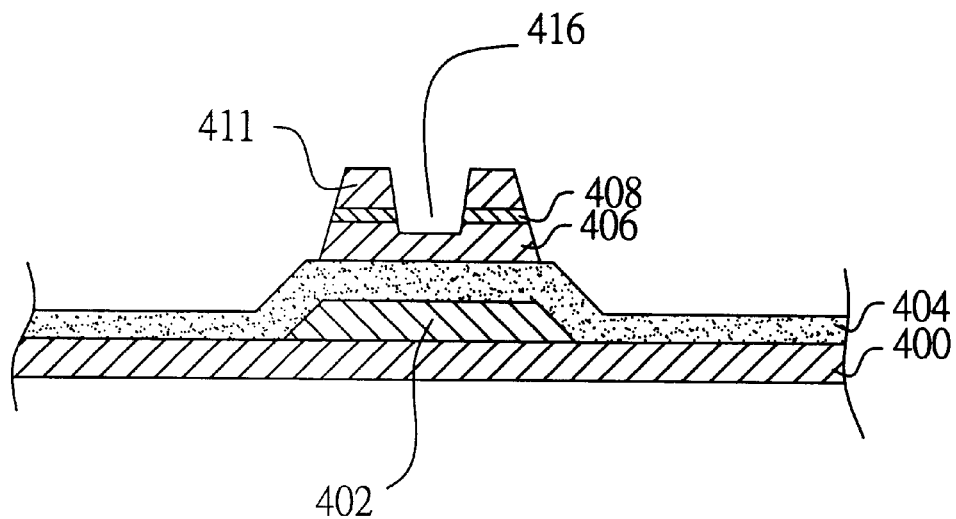

Then, as shown in FIG. 4c, the thickness of the photoresist pattern 411 is reduced, for example by $O_2$ ashing, until the first portion of the photoresist pattern 411 is removed so as to expose the impurity-doped layer 408 at the channel region of TFTs. Thereafter, as shown in FIG. 4d, the impurity-doped layer 408 exposed at the channel region 416 is removed by etching thereby obtaining an amorphous semiconductor pattern 414 (step 305). It should be understood that the amorphous silicon layer 406 underneath the first portion of the photoresist pattern 411 may have a portion being removed in step 305.

After stripping the remaining photoresist, a second metal layer is formed, for example by sputtering on the entire surface of the insulation layer 404 and the amorphous semiconductor pattern 414 to a predetermined thickness (step 306).

Figure 4E:
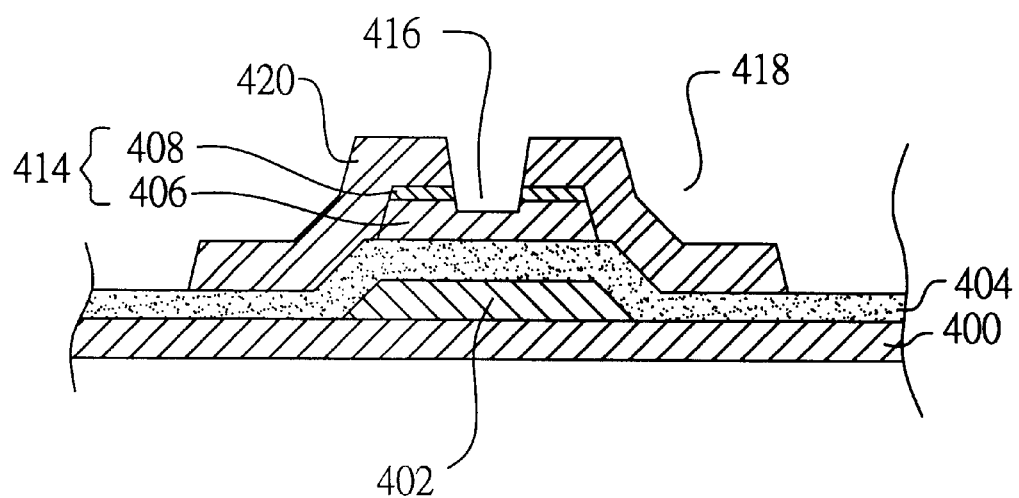

As shown in FIG. 4e, the conductive layer is then patterned by a third photolithography process to form a second metal pattern including a data line (not shown), a source electrode 420 and a drain electrode 418, wherein the source electrode 420 and the drain electrode 418 are separated by the channel portion 416 (step 307).

A passivation layer (not shown, e.g., SiNx layer) is then formed on the entire surface of the above structure to a predetermined thickness (step308). The passivation layer is then patterned to expose parts of the drain electrode 418 using a fourth photolithography process (step 309). After forming an indium-tin-oxide (ITO) layer as a transparent conductive layer on the entire surface of the structure having the passivation layer pattern thereon (step310), the ITO layer is patterned by a fifth photolithography process (step 311) thereby obtaining the TFT panel of the present invention.

Figure 5A:
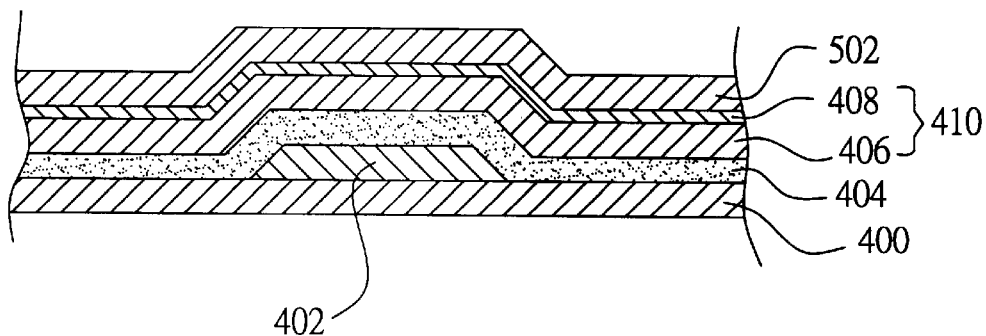
FIGS. 5a–5c illustrate, in cross-sectional view, the steps of forming a photoresist pattern with a concave portion according to a preferred embodiment of the present invention.
Figure 5B:
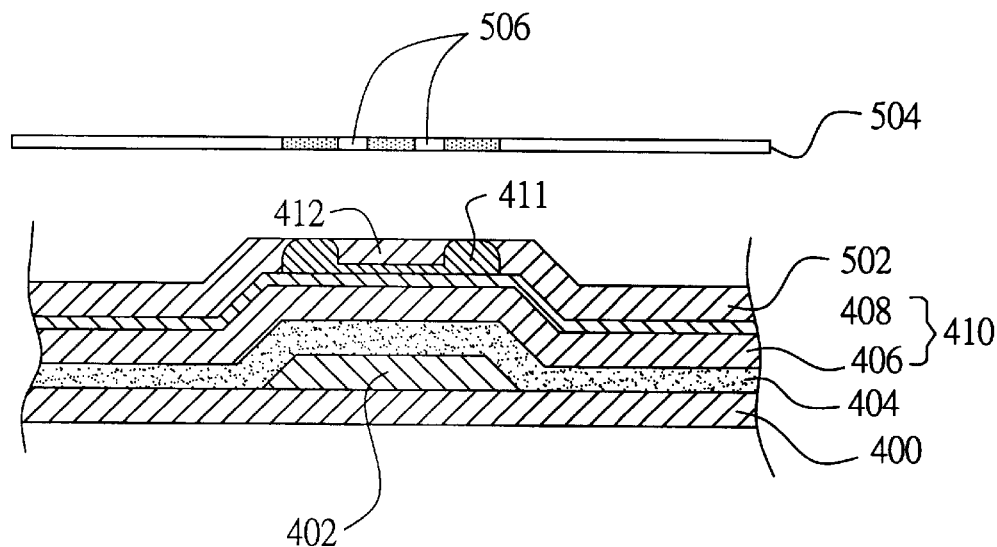
Figure 5C:
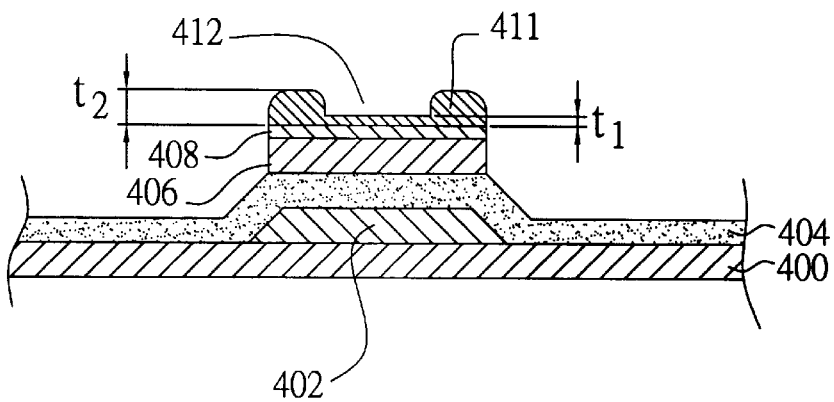

According to a preferred embodiment of the present invention, the photoresist pattern used herein is provided by the following steps. First, referring to FIG. 5a, a photoresist film 502 is formed on the semiconductor layer 410 and the gate insulating layer 404. Next, as shown in FIG. 5b, a mask 504 with a predetermined pattern having slits 506 (only two shown in FIG. 5b) is placed on top of the photoresist film 502 and the photoresist film 502 is exposed to a light. Then, the exposed photoresist film 502 is developed to obtain a photoresist pattern 411 with the concave portion 412 formed corresponding to the slit 506 of the mask 504. As shown in FIG. 5c, the photoresist pattern 411 includes a first portion having a thickness of $t_1$ (i.e., the concave portions 412) facing the channel region of TFTs, a second portion having a thickness of $t_2$ smaller than $t_1$, and a third portion has substantially no photoresist layer.

In the manufacturing method of a thin film transistor panel of the present invention, the patterning processes of the amorphous silicon layer and the impurity-doped layer are performed sequentially. Therefore, the patterning steps described above can be conducted by the same etching equipment so as to skip the additional transportation between different equipments thereby reducing the manufacturing cost and increasing the productivity.

Furthermore, the impurity-doped layer is patterned before forming the second metal pattern so as to prevent the second metal pattern from being corroded by the etchant used in the patterning process thereby resolving the corrosion issue described above.

Although the invention has been explained in relation to its preferred embodiment, it is to be understood that many other possible variations can be made without departing from the spirit and scope of the invention as hereinafter claimed.

What is claimed is:

1. A method for manufacturing a thin film transistor panel, the method comprising the steps of:
    forming a gate line with a gate electrode connected to the gate line on an insulating substrate;
    depositing a gate insulating layer over the gate line;
    forming a semiconductor layer comprising an impurity-doped layer on the gate insulating layer;
    forming a photoresist pattern on the semiconductor layer, the photoresist pattern including a first portion facing a channel region, a second portion that is thicker than the first portion, and a third portion having no photoresist;
    etching the semiconductor layer by using the photoresist pattern as an etch mask to expose the gate insulating layer under the third portion of the photoresist pattern;
    reducing the thickness of the photoresist pattern till the first portion of the photoresist pattern is removed so as to expose the impurity-doped layer at the channel region;
    removing the impurity-doped layer exposed at the channel region; and
    forming a conductive pattern layer with source and drain electrodes over the patterned semiconductor layer and the gate insulating layer, wherein the drain and source electrodes are separated by the channel region.

2. The method as claimed in claim 1, wherein the photoresist pattern is formed by the steps of:
    forming a photoresist film on the semiconductor layer;
    placing a mask with a predetermined pattern having at least a slit on top of the photoresist film, and exposing the photoresist film to a light; and
    developing the exposed photoresist film to obtain the photoresist pattern.

3. The method as claimed in claim 1, wherein the semiconductor layer is an amorphous silicon layer.

4. The method as claimed in claim 1, wherein the impurity-doped layer is an $n^+$ impurity amorphous silicon layer.

5. A method for manufacturing a thin film transistor panel, the method comprising the steps of:
    forming a gate line with a gate electrode connected to the gate line on an insulating substrate;
    forming a gate insulating layer over the gate line;
    forming an amorphous silicon layer on the gate insulating layer;
    forming an ohmic contact layer on the semiconductor layer;
    forming a photoresist pattern on the ohmic contact layer wherein the photoresist pattern includes a first portion having a first thickness facing an channel region of the TFT, a second portion having a second thickness thicker than the first thickness, and a third portion substantially having no photoresist pattern;
    removing the ohmic contact layer and the semiconductor layer under the third portion of the photoresist pattern;
    removing the first portion of the photoresist pattern to expose the ohmic contact layer;
    removing the ohmic contact layer exposed through the photoresist pattern; and
    forming a conductive pattern layer with source and drain electrodes over the patterned semiconductor layer and the gate insulating layer, wherein the drain and source electrodes are separated by the channel region.

6. The method as claimed in claim 5, wherein the photoresist pattern is formed by the steps of:
    forming a photoresist film on the semiconductor layer;
    placing a mask with a predetermined pattern having at least a slit on top of the photoresist film, and exposing the photoresist film to a light; and
    developing the exposed photoresist film to obtain the photoresist pattern.

7. The method as claimed in claim 5, wherein the semiconductor layer is an amorphous silicon layer.

8. The method as claimed in claim 5, wherein the ohmic contact layer is an $n^+$ impurity amorphous silicon layer.

9. A method for manufacturing a thin film transistor panel, the method comprising the steps of:
    forming a gate electrode, a gate insulating layer, a semiconductor layer comprising an ohmic contact layer on an insulating substrate;
    forming a photoresist pattern on the ohmic contact layer wherein the photoresist pattern includes a first portion having a first thickness facing a channel region, a second portion having a second thickness thicker than the first thickness, and a third portion substantially having no photoresist pattern;
    removing the semiconductor layer under the third portion of the photoresist pattern;
    removing the first portion of the photoresist pattern;
    removing the ohmic contact layer underneath the first portion of the photoresist pattern; and
    forming a conductive pattern layer with source and drain electrodes over the patterned semiconductor layer and the gate insulating layer, wherein the drain and source electrodes are separated by the channel region.

10. The method as claimed in claim 9, wherein the photoresist pattern is formed by the steps of:
    forming a photoresist film on the semiconductor layer;
    placing a mask with a predetermined pattern having at least a slit on top of the photoresist film, and exposing the photoresist film to a light; and
    developing the exposed photoresist film to obtain the photoresist pattern.

11. The method as claimed in claim 9, wherein the semiconductor layer is an amorphous silicon layer.

12. The method as claimed in claim 9, wherein a portion of the amorphous silicon layer underneath the first portion of the photoresist pattern is removed in the step of removing the ohmic contact layer underneath the first portion of the photoresist pattern.

13. The method as claimed in claim 9, wherein the ohmic contact layer is an $n^+$ impurity amorphous silicon layer.

* * * * *